United States Patent [19]
Reimer et al.

[11] Patent Number: 4,894,910
[45] Date of Patent: Jan. 23, 1990

[54] PIN GRID ARRAY REMOVAL TOOL

[75] Inventors: William A. Reimer, Wheaton; David L. Vonder, Addison, both of Ill.

[73] Assignee: GTE Communicaton Systems, Inc., Phoenix, Ariz.

[21] Appl. No.: 237,462

[22] Filed: Aug. 29, 1988

[51] Int. Cl.$^4$ .............................................. H05K 13/04
[52] U.S. Cl. ........................................ 29/764; 29/244; 29/762; 228/264
[58] Field of Search ................. 29/762, 764, 239, 244, 29/758, 281.6; 228/264; 219/243

[56] References Cited

U.S. PATENT DOCUMENTS

| | | | |
|---|---|---|---|
| 3,377,689 | 4/1968 | Kimmett | 29/764 |
| 3,557,430 | 1/1971 | Jones | 29/762 X |
| 3,990,863 | 11/1976 | Palmer | 29/764 |

Primary Examiner—Carl E. Hall
Attorney, Agent, or Firm—Robert J. Black; Gregory G. Hendricks

[57] ABSTRACT

A tool adapted to facilitate the removal of elements such as pin grid arrays, pin grid array sockets, chip carriers, and chip carrier sockets which have been soldered into plated through holes or similar elements of printed wiring cards. A platform is provided mounting two pivotable arms which are used to grip onto the element to be removed while a number of spring loaded posts are compressed to provide connection to the printed wiring card on which the element to be removed is attached. The entire assembly is then placed in a high temperature environment causing the solder to melt at which time the compressed springs, associated with the posts, effectively expand withdrawing the element from the printed wiring card.

12 Claims, 2 Drawing Sheets

PIN GRID ARRAY REMOVAL TOOL

BACKGROUND OF THE INVENTION

1. FIELD OF THE INVENTION

The present invention relates to pin grid arrays and more particularly to a tool designed to facilitate the removal of elements such as pin grid arrays which are either surface mounted or soldered into plated through holes in printed wiring cards.

2. BACKGROUND INFORMATION

Pin grid arrays are being designed into products to take advantage of their high packaging density, versatility and high speed operation. Pin grid arrays are available in ceramic packages which are either surface mounted or soldered into plated through holes in a printed wiring card. In many applications, pin grid arrays are inserted into sockets which are in turn soldered into plated through holes in printed wiring cards. In many instances these devices are attached to multilayer printed wiring boards that are very expensive to manufacture. In the ordinary course of events it frequently becomes necessary for a pin grid array or similar device to be removed and replaced with another such device either as a repair procedure or as a result of a design modification. Both of these procedures require that the original device be removed without damaging the very expensive printed wiring card which in turn may have many other expensive components already attached to it.

Pin grid arrays and chip carriers and pin grid array sockets and chip carrier sockets are usually soldered to printed wiring cards by means of wave soldering techniques or solder reflow techniques. Wave soldering is used when through-hole mounted devices are used. On the other hand, solder reflow methods such as vapor phase soldering or infrared soldering are used when surface mounted devices are specified. The majority of pin grid arrays are soldered into the plated through holes in the printed wiring card to facilitate solder joint inspection from the back side of the printed wiring card. The use of surface mounted pin grid arrays covers the surface attaching soldering joints and thus prevents visual inspection after soldering.

It has been determined that pin grid arrays frequently become the device of choice over chip carriers when the input/output lead count exceeds 100. Applying enough heat to simultaneously unsolder 100 or more solder joints without causing damage to the printed wiring card is the principal requirement that needs to be accomplished. It has been determined by experience that the soldering process used to attach the component is probably the best and safest process used to remove the component. However, one does not reach into a vapor phase soldering machine, an infrared machine or a wave soldering machine and lift the pin grid array off the printed wiring card while the solder is still in a molten state. Obviously the temperatures in such an environment are far in excess of that which can be handled manually.

Accordingly, a need is clearly established for some kind of self-actuated removal tool that is able to withstand the high temperatures of the vapor phase, infrared or wave soldering environments, in order to accomplish this final step of a pin grid array removal process. The very same function of lifting the device while the solder is molten is required to replace pin grid array sockets, chip carriers and chip carrier sockets. Accordingly, it is the object of the present disclosure to develop a moval tool which will greatly simplify the repair a replacement procedure of removal of the pin grid arr or similar element from the printed wiring cards.

SUMMARY OF THE INVENTION

A pin grid array removal tool in accordance with t present invention is constructed of metal and plas parts capable of withstanding the high temperatu environments associated with vapor phase solderii infrared soldering or wave soldering equipment. In t manufacture of the plastic parts, polyphenelyene S fide (manufactured under the trade name Ryton Phillips Chemical Corp.) is the plastic of choice. A usable as an alternative is Rynite (manufactured DuPont) which provides an alternative that works a is slightly less expensive. The eyelets, springs and be ing pins utilized in the present invention are conve tional metals normally used for such purposes.

The removal tool consists of a square plastic platfo slightly larger than the element to be removed. T platform, in turn, has a hole in each of its four corn· that four plastic posts pass through. The platform, ì cause of the size of the holes, is able to slide up a down on these four posts. The posts have nail-he stops on both ends which prevent the platform fr< sliding off of either end.

Four helical springs are mounted around the po between the underside of the platform and the bott< nail-head end stops. In the free state, the springs pu the platform to the top of the posts and against the t nail-head end stops. In the middle of two opposite sic of the platform are mounted plastic latching arn These arms are attached to the platform via molded· bearing supports and pivot bearing pins. In the midc of the platform a flat spring is fastened using two ey lets. The flat spring is shaped in such a manner as push the tops of the locking arms in an outward dire tion and the bottoms of the arms are therefore pivot in the inward direction. The bottom ends of the ar: are equipped with molded-in fingers and/or metal taining clips that are capable of slipping under and/ grabbing the edges of a pin grid array substrate.

Also molded into the bottoms of two diagonally c posite nail-head stops are snap-in studs used to fasten t pin grid array removal tool of the present invention the printed wiring card substrate. Two appropriatε sized and located holes must be provided in the print wiring card for the snap in studs. This prevents t removal tool and pin grid array from falling off t printed card after the pin grid array has been extract from its solder joints.

To remove a soldered-in pin grid array, the remov tool is centered over the device and its two snap studs are aligned with the corresponding holes in t printed wiring card. The tool is snapped onto the boε and held in place by the studs. The latching arms ε pinched together and the entire platform is push down against the four compression springs until t grabbing fingers of the latching arms can be slid unc the pin grid array substrate. The latching arms are leased and the retaining clips (if used) are pushed do\ to the top surface of the pin grid array substrate. T printed wiring card is now ready to enter the desold ing process (vapor phase, infrared or wave solder).

When the solder joints reflow (that is to say, wh the solder becomes molten), the platform will lift pin grid array out of or off of the printed wiring card under the influence of the four compressed springs. The platform raises until it stops against the four top nail-head stops located on the top of the four corner posts. The pin grid array is thus removed from the printed wiring card and is held in mid-air, grasped by the two latching arms. After the entire printed wiring card assembly has cooled sufficiently, the pin grid array may be removed from the tool by pinching the two latching arms together manually. The pin grid array removal tool is then popped off the printed wiring card by pulling its two snap-in studs out of their respective holes. The pin grid array removal tool can then be reused again and again.

DESCRIPTION OF THE PREFERRED EMBODIMENT

Figure 1:
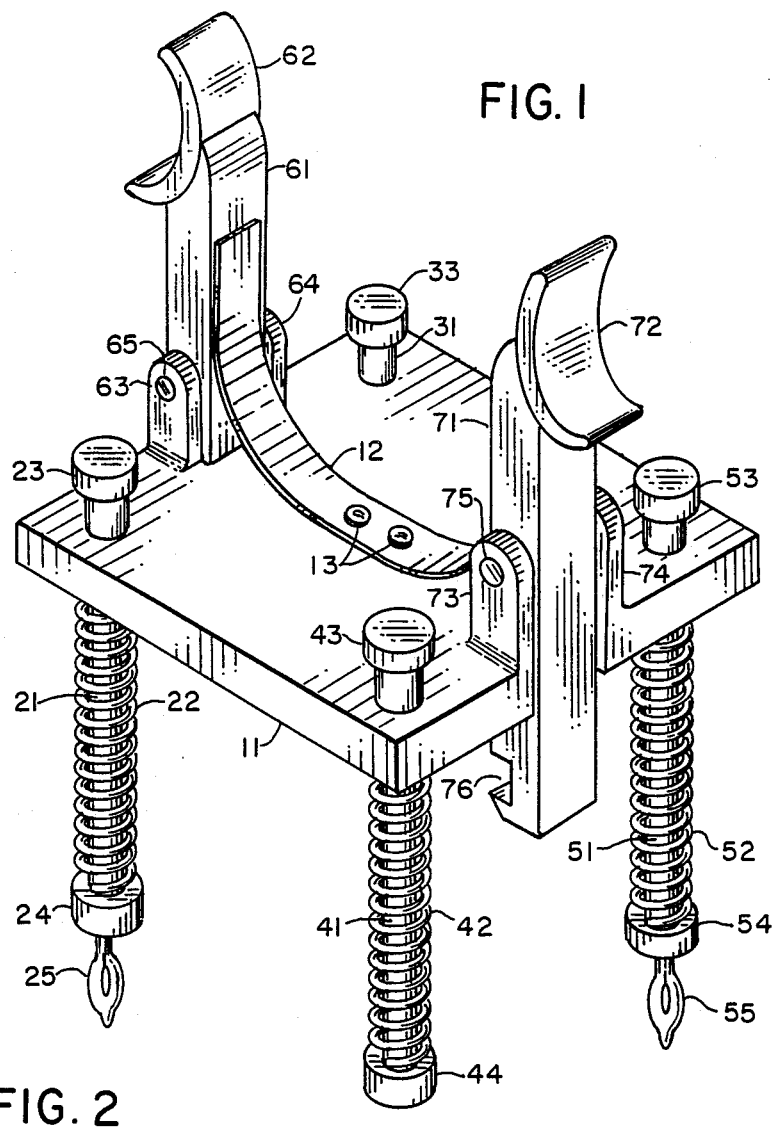
FIG. 1 is a perspective view of a pin grid array removal tool in accordance with the present invention.

Referring first to FIG. 1, the pin grid array removal tool in accordance with the present invention consists of a square, plastic platform 11 usually constructed of polyphenelyene sulfide, a plastic essentially capable of withstanding very high temperature environments associated with the various reflow soldering techniques employed in the pin grid array field, such as vapor phase soldering, infrared soldering, or wave soldering.

Located in each of the four corners is an opening in which a plastic post, such as 21, 31, 41 and 51 pass through. The fit of the posts through the plastic base is such that the platform can slide up and down on these four posts. Each of the posts has nail-head stops, such as 23, 24, 33, 34 (not shown), 43, 44, and 53 and 54.

Figure 2:
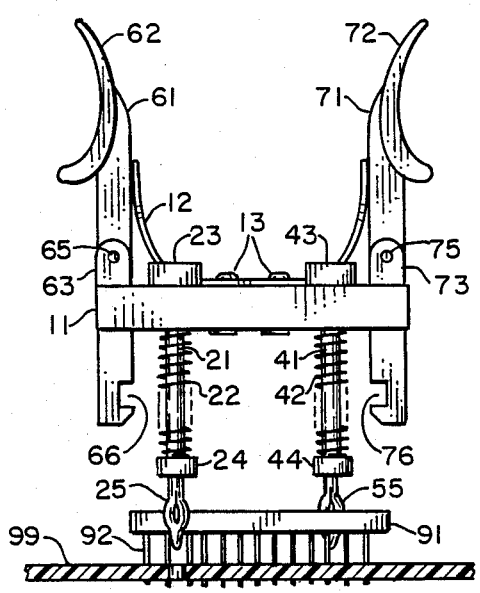
FIG. 2 is a side view of a pin grid array removal tool in accordance with the present invention being positioned for a pin grid array to be removed from an associated printed circuit card.
Figure 3:
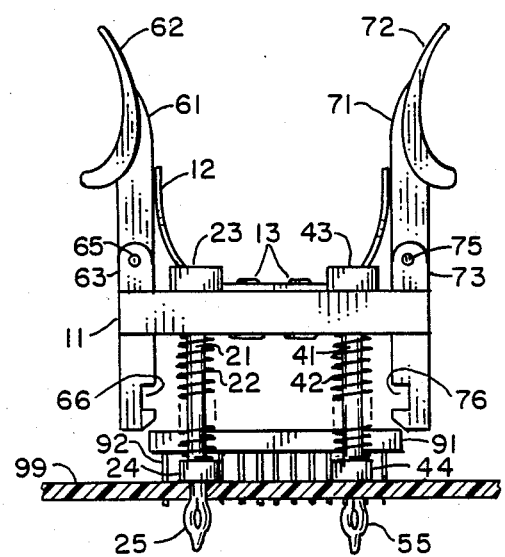
FIG. 3 is a side view of a pin grid array in accordance with the present invention being inserted into a printed circuit board and adjacent to the pin grid array being removed from an associated printed circuit board.
Figure 4:
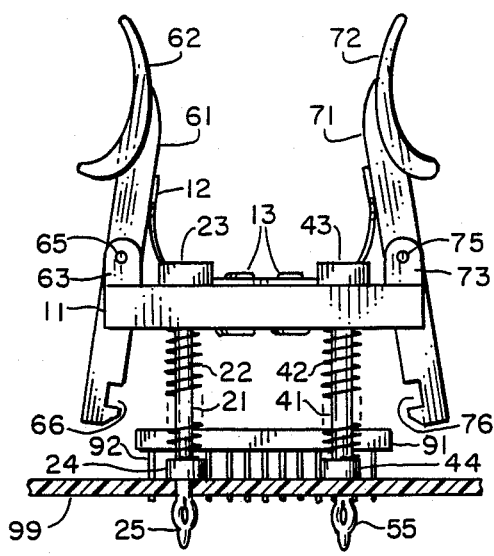
FIG. 4 is a side view of a pin grid array removal tool in accordance with the present invention with the latching arms actuated prior to grasping the pin grid array to be removed from the associated printed circuit board.
Figure 5:
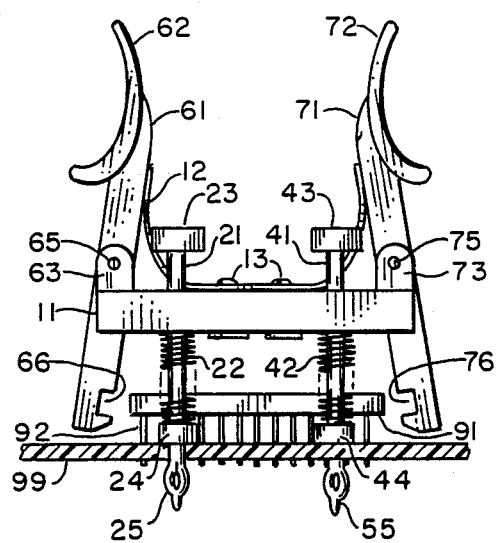
FIG. 5 is a side view of a pin grid array removal tool in accordance with the present invention with the platform being depressed following actuation of latching arms and prior to grasping of the pin grid array to be removed from the associated printed circuit board.
Figure 6:
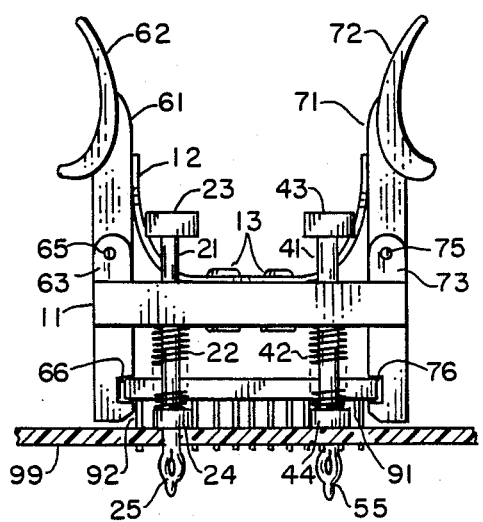
FIG. 6 is a side view of a pin grid array removal tool in accordance with the present invention showing the retaining fingers grasping the edge of the pin grid array to be removed from the associated printed circuit board and the latching arms restored to their normal position after grasping takes place.
Figure 7:
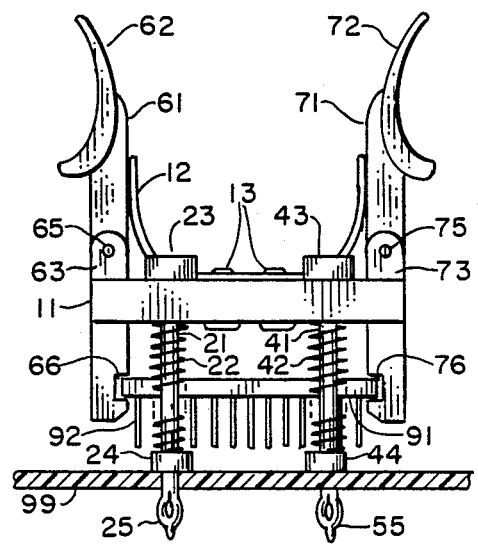
FIG. 7 is a side view of a pin grid array removal tool in accordance with the present invention showing the pin grid array removed from the associated printed wiring board as the result of the entire assembly being placed in a reflow environment wherein the sections of the pin grid array have been released from the associated printed wiring card as a result of the solder that retained the pin grid array within the printed wiring board having been melted by being placed in the reflow environment.

On each of the four posts 21, 31, 41, and 51, there is located a helical spring, such as 22, 32 (not shown), 42, and 52, respectively, which are positioned between the lower nail-head stop and the bottom of the platform to normally maintain the platform in the upper position against the upper nail-head stop, such as 23, 33, 43, and 53. It can be readily seen in FIG. 2, the manner in which the springs push the platform to the top of the posts against the aforementioned stops.

In the middle of two opposite sides of the platform are mounted plastic latching arms 61 and 71, respectively. These arms are attached via molded-in bearing support elements, such as 63 and 64, 73 and 74, respectively, which are actually part of the platform 11. The arms, in turn, are pivotally supported by these bearing support units by bearing pins such as 65 and 75. The bottom ends of the arms are equipped with molded-in fingers 76 and 66 (not shown) and may be equipped with metal retaining clips (not shown) capable of slipping under or grabbing the edges of the a pin grid array substrate. Such metal clips are usable where the thickness of the substrates to be removed by the tool may vary. It should also be noted that attached to the upper end of each of the latching arms 61 and 71, respectively, are finger grips 62 and 72 which facilitate the manual grasping of the fingers so that they may be spread and pressure applied against spring 12 forcing the finger portion 66 (not shown) and 76 in an outward direction to go over the edges of a pin grid array intended for removal from an associated printed circuit board.

Molded into the bottoms of the two diagonally opposite nail-head stops 24 and 54, respectively, are snap-in studs 25 and 55 that are used to fasten the pin grid array removal tool to the printed wiring card substrate. To facilitate the use of the tool in accordance with the present invention, two appropriately sized and located holes must be provided in the printed wiring card for the snap-in studs. These studs 25 and 55 prevent the removal tool in accordance with the present invention and the pin grid array from falling off the printed wiring card after the pin grid array has been extracted from its solder joints.

Use of the pin grid removal tool in accordance with the present invention will be best understood by reference to FIGS. 2-7 in which the steps encountered in removal of the pin grid array from the associated wiring card are shown based on use of the pin grid array removal tool of the present invention.

To remove a soldered-in pin grid array, such as 91, from an associated printed wiring card 99 where connection is established by the pins 92 which have been soldered in, the removal tool is centered over the pin grid array device 91 and its two snap-in studs 25 and 55 are aligned (see FIG. 2) with corresponding holes in the printed wiring card 99. The tool is then snapped into the board and held in place by the studs 25 and 55 (see FIG. 3). The latching arms 61 and 71 are then pinched together by grips 62 and 72 and manually forcing them together against the pressure of the spring 12 (see FIG. 4). The entire platform 11 is then pushed in a downward direction against the four compression springs 22, 32 (not shown), 42, and 52 (see FIG. 5). This downward motion is continued until the grabbing fingers 66 and 76 of the latching arm 61 and 71, respectively, can be slid under the pin grid array substrate 91. At this point the latching arms 61 and 71 are released (see FIG. 6) and any retaining clips, if used, are pushed down to the top surface of the pin grid array substrate. As shown in the drawings, the fingers 66 and 76 provide accurate spacing about the pin grid array, no retaining clips are required.

The printed wiring card is now ready to be placed into the desoldering process environment, such as vapor phase soldering, infrared soldering, or wave soldering. On exposure to the heat present in the soldering environment, the solder joints reflow (that is the solder becomes molten). At this point, the platform 11 lifts the pin grid array out of or off of the printed wiring card under the influence of the four compression springs 22, 32, 42, and 52. This can be seen by reference to FIG. 7. The platform 11 raises until it stops against the four nail-head stops 23, 33, 43, and 53 on the top of the four-corner post 21, 31, 41, and 51, respectively. The pin grid array 91 has thus been removed from the printed wiring card 99 and is held in mid air, grasped by the two latching arms 61 and 71, respectively. After the entire printed wiring card assembly has cooled sufficiently, the pin grid array may be removed from the tool by pinching the two latching arms together. The pin grid array removal tool is then popped off the printed wiring card by pulling its two snap-in studs out of the respective holes. The pin grid array removal tool can thus be reused again and again.

While but a single embodiment of the present invention has been shown it will be obvious to those skilled in the art that numerous modifications can be made without departing from the spirit of the invention which shall be limited only by the scope of the claims appended hereto.

What is claimed is:

1. Apparatus for the removal of elements which have been soldered to printed wiring cards, from said cards, said apparatus comprising:
   a platform, including top and bottom sides;
   a plurality of posts, each including first and second ends, passing through said platform;
   each of said posts including at said first and second ends projections to prevent said post from being removed from said platform;
   said posts each further including a helical spring surrounding said post and extending between said bottom side of said platform and said projection at said second end of said post;
   a plurality of arms pivotally mounted to said platform;
   each of said arms including retention means for grasping said element;
   and one or more of said posts further including mea adjacent to said second end projection to secu said apparatus to a printed wiring card;
   whereby in response to securing of said apparatus a printed wiring card and said retention mea grasping said element, said springs are compress and in response to placement of said apparatus, s element and printed wiring card, into a high te perature environment, said solder joining said e ment to said printed wiring card is caused to refl and said springs expand to raise said platform withdraw said element from said printed wiri card.

2. Apparatus as claimed in claim 1 wherein:
said projections on the first and second ends of s posts comprise nail-head stops.

3. Apparatus as claimed in claim 1 wherein:
said means included in one or more of said posts secure said apparatus to a printed wiring ca comprise snap-in studs to be inserted in holes said printed wiring card.

4. Apparatus as claimed in claim 1 wherein:
the arms are pivotally mounted.

5. Apparatus as claimed in claim 4 wherein:
there are further included bearing supports mold into said platform, for supporting said pivota mounted arms.

6. Apparatus as claimed in claim 5 wherein:
there are further included bearing pins position through said bearing supports and said arms fac tating the pivotal movement of said arms.

7. Apparatus as claimed in claim 1 wherein:
each of said arms further includes a grip to facilit the manual operation to pivot said arms.

8. Apparatus as claimed in claim 1 wherein:
said retention means further include adjustable cli for grasping of elements of different sizes.

9. Apparatus as claimed in claim 1 wherein:
there is further included a return spring secured said platform and extending to exert pressure each of said arms.

10. Apparatus as claimed in claim 1 wherein:
said platform is constructed of plastic resistant to hi temperature environments.

11. Apparatus as claimed in claim 1 wherein:
said platform is constructed of polyphenelyene s fide plastic to facilitate operation in high tempe ture environments.

12. Apparatus as claimed in claim 1 wherein:
said posts and said arms are constructed of plas resistant to high temperature environments.

* * * * *